(12) United States Patent
Ro et al.

(10) Patent No.: US 11,124,071 B2
(45) Date of Patent: Sep. 21, 2021

(54) CONTROL PANEL HAVING BUTTONS CONDUCTIVELY PARTITIONED

(71) Applicants: HYUNDAI MOTOR COMPANY, Seoul (KR); KIA MOTORS CORPORATION, Seoul (KR)

(72) Inventors: Heejin Ro, Seoul (KR); Gideok Kwon, Seoul (KR); Donghee Seok, Suwon-Si (KR); Jong Bok Lee, Suwon-Si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 567 days.

(21) Appl. No.: 16/030,152

(22) Filed: Jul. 9, 2018

(65) Prior Publication Data

US 2019/0126754 A1 May 2, 2019

(30) Foreign Application Priority Data

Nov. 1, 2017 (KR) .................. 10-2017-0144445

(51) Int. Cl.

| *B60K 37/06* | (2006.01) |
| *H03K 17/96* | (2006.01) |
| *B60R 16/00* | (2006.01) |
| *B60R 16/023* | (2006.01) |
| *H02H 9/04* | (2006.01) |

(52) U.S. Cl.
CPC ............ *B60K 37/06* (2013.01); *B60R 16/005* (2013.01); *B60R 16/023* (2013.01); *H02H 9/045* (2013.01); *H03K 17/96* (2013.01); *H03K 17/962* (2013.01); *B60K 2370/11* (2019.05); *B60K 2370/139* (2019.05); *H03K 2017/9602* (2013.01); *H03K 2217/96015* (2013.01); *H03K 2217/96054* (2013.01); *H03K 2217/960755* (2013.01); *H03K 2217/960765* (2013.01)

(58) Field of Classification Search
CPC ..... B60R 16/005; B60R 16/023; B60K 37/06; B60K 2370/139; B60K 2370/11; H03K 17/962; H03K 17/96; H03K 2217/960755; H03K 2217/960765; H03K 2217/96015; H03K 2217/96054; H03K 2217/96

See application file for complete search history.

(56) References Cited

U.S. PATENT DOCUMENTS

2013/0343026 A1* 12/2013 La Paglia .............. H01H 13/86
361/809

* cited by examiner

*Primary Examiner* — Rafael O De Leon Domenech
(74) *Attorney, Agent, or Firm* — Morgan, Lewis & Bockius LLP

(57) ABSTRACT

A control panel for a vehicle includes a plurality of buttons disposed on the control panel, and at least one conductive rib disposed on the plurality of buttons. The control panel is made of a non-conductive material. The conductive rib is connected to an electrostatic protection circuit or a touch controller so that the electrostatic protection can be realized through the conductive rib or the conductive rib can serve as a touch button.

10 Claims, 8 Drawing Sheets

CONTROL PANEL HAVING BUTTONS CONDUCTIVELY PARTITIONED

CROSS-REFERENCE TO RELATED APPLICATION(S)

This application claims the benefit of Korean Patent Application No. 10-2017-0144445, filed on Nov. 1, 2017 in the Korean Intellectual Property Office, the disclosure of which is incorporated herein by reference.

TECHNICAL FIELD

The present disclosure relates a control panel for a vehicle contained in an air conditioning device and an audio device of the vehicle.

BACKGROUND

In a center fascia of a vehicle, an air conditioning device for controlling a temperature, a humidity, and an air cleanliness of the inside of the vehicle, and an audio device for controlling the sound of the inside of the vehicle are disposed.

A control panel configured to allow a user to control the air conditioning device and the audio device is provided on a front surface of the air conditioning device and the audio device, and a variety of buttons is disposed in the control panel so that a user selects a function.

Since a user's hand is in a direct contact with the button of the control panel, static electricity caused by the potential difference may be inevitably generated during the user is in a contact with the control panel.

Further, an audio device, an air conditioning device and, a navigation system are disposed in a limited space corresponding to the center fascia of the vehicle. In addition, since the devices must be installed in a limited space and it may be difficult for a user to operate the buttons when the size of the buttons is smaller than a certain size, only a limited number of buttons may be disposed in each device.

SUMMARY

It is an aspect of the present disclosure to provide a control panel for a vehicle capable of protecting a vehicle system from static electricity generated in the control panel.

It is another aspect of the present disclosure to provide a control panel for a vehicle capable of performing more number of controls by the same number of buttons.

Additional aspects of the present disclosure will be set forth in part in the description which follows and, in part, will be obvious from the description, or may be learned by practice of the present disclosure.

According to an exemplary embodiment of the present disclosure, a control panel for a vehicle includes: a plurality of buttons disposed on the panel; and at least one conductive rib disposed on the plurality of buttons. The control panel may be made of a non-conductive material.

The plurality of buttons may include a first set of buttons at a left side of the control panel and a second set of buttons at a right side of the control panel. The first set of buttons may be spaced apart from the second set of buttons. The at least one conductive rib may include a conductive rib extending vertically and disposed on the plurality of buttons.

The plurality of buttons may include a first set of buttons at a left side of the control panel and a second set of buttons at a right side of the control panel. The first set of buttons are spaced apart from the second set of buttons. the at least one conductive rib integrally comprises a plurality of partition portions extending vertically and disposed between the plurality of buttons, and an upper end connecting portion connecting an upper end of the plurality of partition portions to each other.

The at least one conductive rib may further integrally include a lower end connecting portion configured to connect a lower end of the plurality of partition portions to each other.

The plurality of buttons may include a touch button.

The plurality of buttons may include a push button and are disposed be movable back and forth.

The plurality of buttons may be simultaneously operated as a touch button and a push button.

The controller panel may include: a frame mounted at an outer side of the control panel; an electrode connected to the frame; and a metal layer formed on an outer surface of the frame to be connected to the electrode. The metal layer may include conductive rib.

The metal layer may be connected to an electrostatic protection circuit.

The metal layer may be connected to a touch controller.

The electrode may be formed on the frame by a laser directing structuring (LDS).

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Reference will now be made in detail to embodiments of the present disclosure, examples of which are illustrated in the accompanying drawings.

Figure 1:
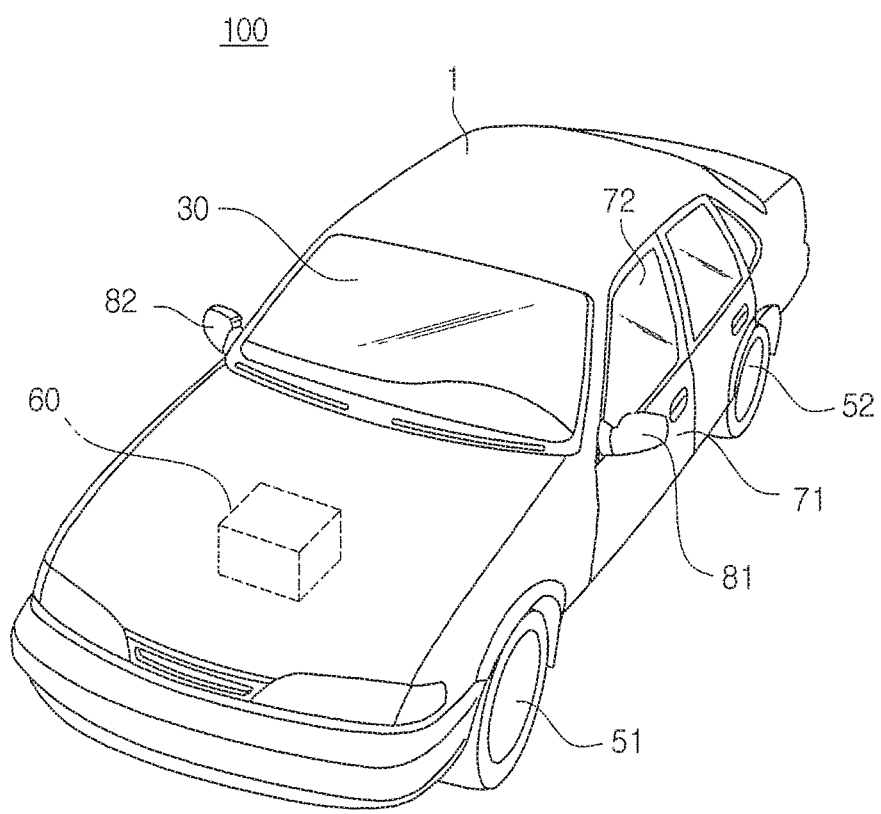
FIG. 1 is a view illustrating an appearance of a vehicle according to an embodiment of the present disclosure.

FIG. 1 is a view illustrating an exterior of a vehicle in accordance with an embodiment of the present disclosure.

Referring to FIG. 1, according to an embodiment, a vehicle 100 may include a body 1 forming an exterior of the vehicle 100, a front glass 30 providing a front view of the vehicle 100 to a driver inside the vehicle 100, vehicle wheels 51 and 52 moving the vehicle 100, a driving device 60 rotating the vehicle wheels 51 and 52, a door 71 closing the inside of the vehicle 100 from the outside, and side mirrors 81 and 82 providing a view of a rear side of the vehicle 100 to the driver.

The front glass 30 may be provided on an upper portion of the front of the body 1 to allow a driver inside the vehicle 100 to acquire visual information about the front of the vehicle 100 and may be referred to as "windshield glass".

The vehicle wheels 51 and 52 may include a front wheel 51 provided on a front of the vehicle 100 and a rear wheel 52 provided on a rear of the vehicle 100. The driving device 60 may supply a torque to the front wheel 51 and the rear wheel 52 so that the body 1 may be moved forward and backward. The driving device 60 may employ an engine configured to generate a torque by burning fossil fuel or a motor configured to generate a torque by receiving power source from a capacitor (not shown).

The door 71 may be rotatably provided on a right side and a left side of the body 1. When the door 71 is opened, a driver may be allowed to be seated in the vehicle 100, and when the door 71 is closed, the inside of the vehicle 100 may be closed from the outside. The door 71 may be provided with a window 72 that allows a driver to see the outside or the inside from the outside. According to the embodiment, the window 72 may be openable and closable and configured to allow a driver to see from only one side.

Figure 2:
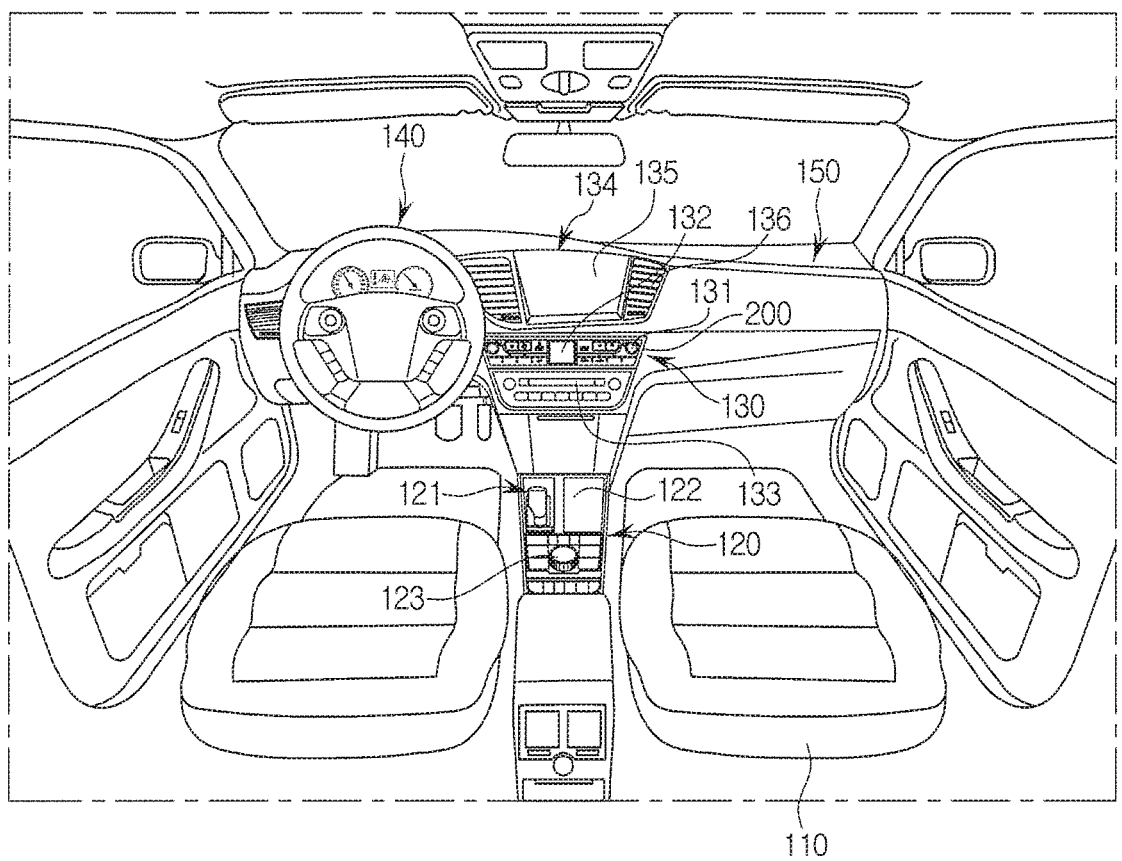
FIG. 2 is a view illustrating an interior of the vehicle according to an embodiment of the present disclosure.

The side mirrors 81 and 82 may include a left side mirror 81 provided on the left side of the body 1 and a right side mirror 82 provided on the right side of the body 1, and may allow a driver inside the vehicle 100 to acquire visual information of the lateral side and the rear side of the vehicle 100, FIG. 2 is a view illustrating a configuration of an interior of the vehicle in accordance with an embodiment of the present disclosure.

Referring to FIG. 2, a seat 110, in which a driver or a passenger is seated, and a dashboard 150 in which a gear box 120, a center fascia 130, and a steering wheel 140 are provided, may be provided in the vehicle 100.

In the gear box 120, a gear lever 121 configured to change a speed of the vehicle 100 and a touch pad 122 configured to control an operation of the vehicle 100 may be installed. Alternatively, a dial operating portion 123 may be selectively provided in the gear box 120, as needed.

In the center fascia 130, an air conditioning device 131, a clock 132, an audio device 133 and an audio, video, and navigation (AVN) device 134 may be installed.

The air conditioning device 131 may keep an air inside the vehicle 100 in fresh by controlling temperature, humidity, air cleanliness, and the flow of air of the inside of the vehicle 100. The air conditioning device 131 may include at least one discharging port 131*a* installed in the center fascia 130 and configured to discharge air.

The clock 132 may be provided around a button or a dial controlling the air conditioning device 131.

The audio device 133 may provide a radio mode configure to provide a radio function, and a media mode configured to play an audio file of various storage media in which the audio file is stored.

The AVN device 134 may be embedded in the center fascia 130 of the vehicle 100. The AVN device 134 may be configured to integrally perform the audio function, the video function and the navigation function by the operation of the AVN device 134. The AVN device 134 may include a display 135 configured to receive a user command related to the AVN device 134, and configured to display a screen related to the audio function, a screen related to the video function and a screen related to the navigation function.

The air conditioning device 131 and the audio device 133 are provided with a control panel 200 provided on a front surface thereof to allow a user to select a function of the air conditioning device 131 and the audio device 133.

Hereinafter the control panel 200 applied to the air conditioning device 131 will be described as an example.

Figure 3:
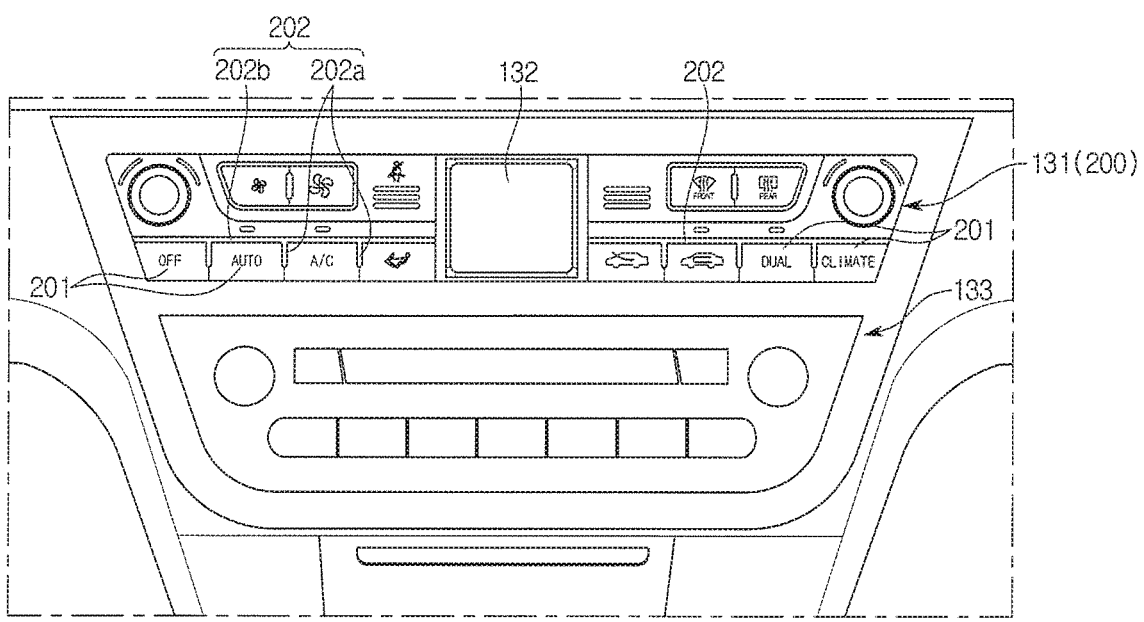
FIG. 3 is a view illustrating a state where a control panel according to a first embodiment of the present disclosure is installed on a center fascia of the vehicle.

As illustrated in FIG. 3, the control panel 200 includes a plurality of buttons 201 configured to control an operation thereof. The control panel 200 also includes a conductive rib 202 provided between the plurality of buttons 201 to allow a user to easily identify boundaries of the buttons 201.

The plurality of buttons 201 are disposed side by side in the left and right direction. The buttons 201 may employ a touch type button operated in a touch manner, or a physical type button installed to move back and forth and operated by physically pressing a switch (not shown), which is provided inside of the control panel 200.

The button 201 may be used simultaneously as the touch type button and the physical type button. That is, it is possible to allow two operations to be selected by using a single button such that one operation is selected by one button in the touch manner and another operation is selected by moving the button by an external force.

The conductive rib 202 may protrude from the control panel 200 toward the front side in which a user is positioned so that the user can recognize the boundary between the buttons 201 through the tactile sense. The conductive rib 202 may be made of a conductive material and connected to an electrostatic protection circuit 251 or a touch controller 252 through electrodes, described later.

The conductive rib 202 includes a partition portion 202*a* vertically extended to partition between the buttons 201, and an upper end connecting portion 202*b* configured to connect an upper end portion of the partition portions 202*a* so as to divide a space into a region in which the buttons 201 are installed, and an upper side space.

Figure 4:
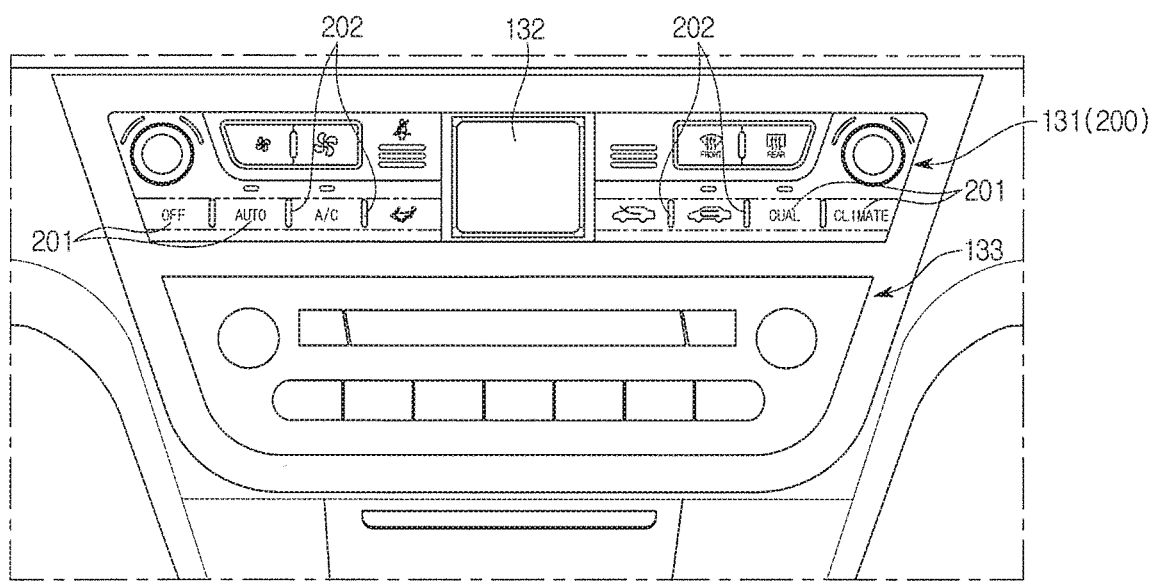
FIG. 4 is a view illustrating a control panel for the vehicle according to a second embodiment of the present disclosure installed on a center fascia of the vehicle.

According to an embodiment, the conductive rib 202 includes a plurality of partition portions 202*a* and a single upper end connecting portion 202*b*, but is not limited thereto. As illustrated in FIG. 4, a plurality of conductive ribs 202 may be formed between the plurality of buttons 201. In this time, the conductive rib 202 may be individually connected to the touch controller 252 and thus each of the plurality of conductive ribs 202 may perform the function of the touch button.

Figure 5:
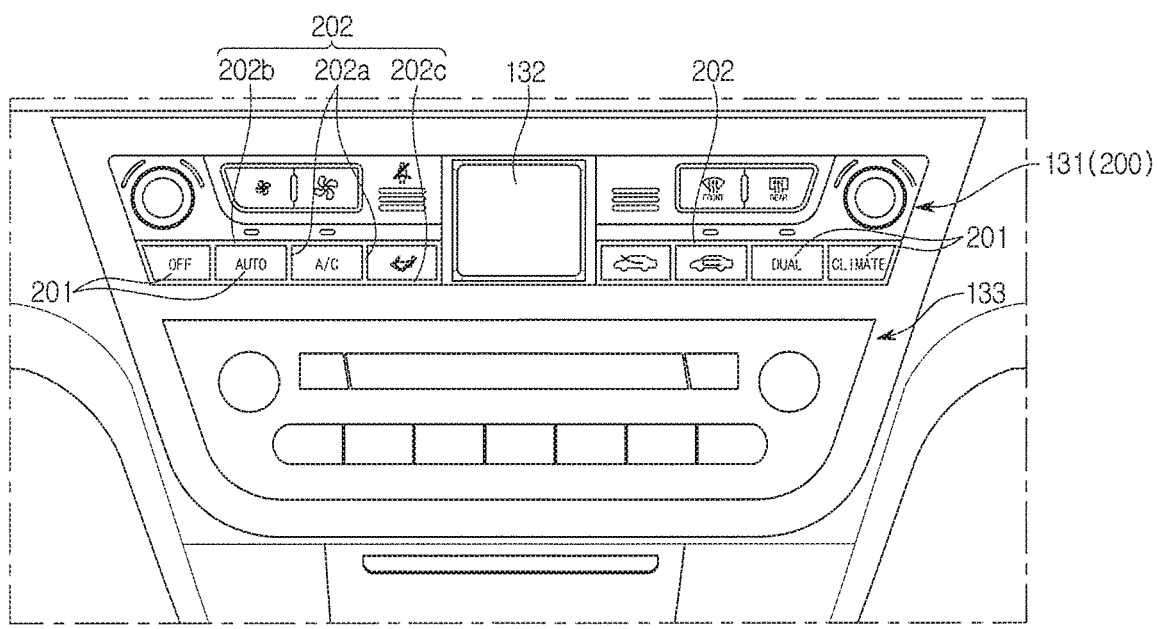
FIG. 5 is a view illustrating a control panel for the vehicle according to a third embodiment of the present disclosure installed on a center pace of the vehicle.

As illustrated in FIG. 5, the conductive rib 202 may include a plurality of partition portion 202*a*, a single upper end connecting portion 202*b* configured to connect an upper end portion of the partition portions 202*a*, and a lower end connecting portion 202*c* configured to connect a lower end portion of the partition portions 202*a* so as to divide a space into a region in which the buttons 201 are installed, and a lower side space.

Figure 6:
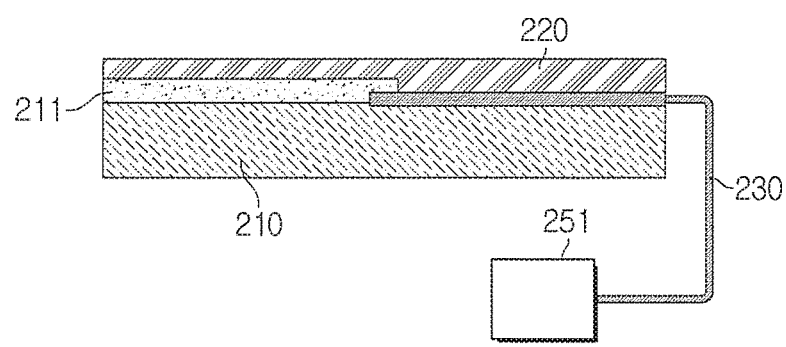
FIG. 6 is a cross-sectional view of a control panel for the vehicle according to the first embodiment of the present disclosure.

As illustrated in FIG. 6, the control panel 200 includes a frame 210 forming an appearance thereof, an electrode 230 formed in the frame 210, and a metal layer 220 formed in an outer surface of the frame 210 to be connected to the electrode 230. By the metal layer 220, the above mentioned conductive rib 202 may be formed.

The metal layer 220 forming the conductive rib 202 is connected to the electrostatic protection circuit 251 through the electrodes 230 formed on the frame 210.

The electrostatic protection circuit 251 is configured to prevent the static electricity, which is generated by the potential difference when a user is positioned adjacent to the button 201, from affecting the electronic system inside the vehicle.

Figure 7:
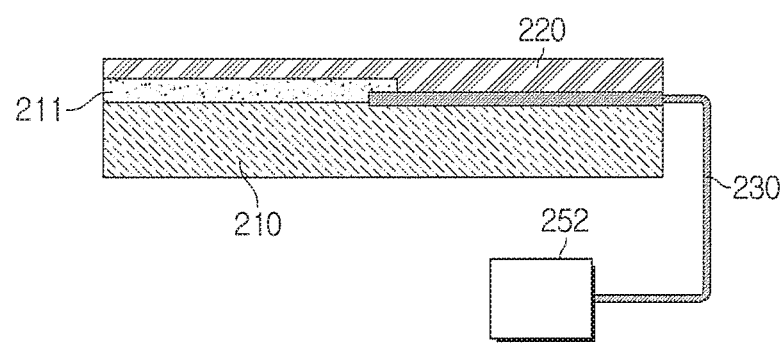
FIG. 7 is a sectional view of a control panel or the vehicle according to a fourth embodiment of the present disclosure.

According to an embodiment, the metal layer 220 forming the conductive rib 202 is connected to the electrostatic protection circuit through the electrode 230, but is not limited thereto. As illustrated in FIG. 7, the metal layer 220 forming the conductive rib 202 may be connected to the touch controller 252 through the electrode 230. That is, when a user is in contact, it may be possible to allow the conductive rib 202 to function as the touch button by transmitting a current change according to the electrostatic capacity of human body, to the touch controller 252.

Figure 8:
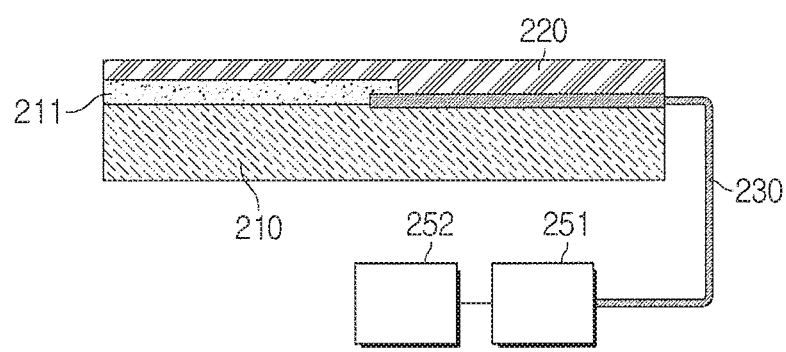
FIG. 8 is a sectional view of a control panel for the vehicle according to a fifth embodiment of the present disclosure.

Alternatively, as illustrated in FIG. 8, the metal layer 220 forming the conductive rib may be connected to the electrostatic protection circuit 251 through the electrode 230, and the touch controller 252 may be connected to the conductive rib 202 through the electrostatic protection circuit 251 and the electrode 230. In this case, the electrostatic protection circuit may prevent the touch controller 252 from being affected by the static electricity.

The frame 210 may be made of a non-conductive material. The frame 210 may be made of a plastic material, and manufactured by injection molding. There is no limitation in a shape of the frame 210 and thus a part of the frame 210 may be provided with a curved surface or a bent surface.

The electrode 230 may be formed on the frame 210 through a Laser Directing Structure (LDS) method. The LDS method represents a method performed by forming a support material by using a material including a metal complex that is non-conductive and chemically stable, exposing a metal seed by breaking a chemical bonding of the metal complex by exposing a part of the support material to a laser, e.g. ultraviolet (UV) laser or excimer laser, and then forming a conductive structure on a laser exposed part of the support material by metalizing the support material.

The frame 210 may be formed of a material including a metal complex. After forming an electrode groove (not shown) on the frame 210 by exposing the frame 210 to the laser, the electrode 230 may be formed by depositing metal on the electrode groove.

The electrode 230 may be provided only in a part of the outer surface of the frame 210. An area in which the electrode 230 is provided on the outer surface of the frame 210 may be a very small area in comparison with the entire outer surface of the frame 210.

A primer layer 211 may be formed on the frame 210 except a part in which the electrode 230 is provided. The primer layer 211 is a structure for stably bonding the metal layer 220 and the frame 210, and serves as a kind of adhesive. The primer layer 211 may be provided on the frame 210 before the metal layer 220 is formed. The primer layer 211 may be formed over a larger area than an area in which the electrode 230 is provided on the frame 210.

FIG. 6 illustrates that a part of the primer layer 211 covers the electrode 230, but is not limited thereto. Alternatively, the primer layer 211 and the electrode 230 may not overlap each other.

The primer layer 211 may be provided only in a part of the outer surface of the frame 210. A metal plating region or a metal deposition region for forming the metal layer 220 may be provided larger than a primer region for forming the primer layer 211.

The metal layer 220 may cover the primer layer 211 and the electrode 230. Since the electrode 230 and the metal layer 220 are in physical contact with each other, the electrode 230 and the metal layer 220 formed of a metal material having the conductivity are electrically connected to each other. Therefore, the metal layer 220 forming the conductive rib 202 protects the internal system from the static electricity acting between the user and the control panel, or the metal layer 220 may be operated as a touch sensor when a user's touch to the conductive rib 202 is transmitted to the touch controller 252.

According to an embodiment, the conductive rib applied to the control panel of the air conditioning device has been described as an example, but is not limited thereto. Alternatively, the conductive rib may be applied to various control panels provided with a plurality of buttons such as a control panel of an audio device.

As is apparent from the above description, it is possible to protect a system of a vehicle from the static electricity since a conductive rib is disposed between buttons of a control panel and the conductive rib is connected to an electrostatic protection circuit through an electrode.

It is further possible to allow a conductive rib to use as a touch button since a conductive rib is disposed between buttons of a control panel and the conductive rib is connected to a touch controller through an electrode.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A control panel for a vehicle comprising:
   a plurality of buttons disposed on the control panel;
   at least one conductive rib disposed on the plurality of buttons;
   a frame disposed on an outer side of the control panel;
   an electrode disposed on the frame; and
   a metal layer disposed on an outer surface of the frame and connected to the electrode,
   wherein the control panel includes a non-conductive material, and
   wherein the metal layer includes the at least one conductive rib.

2. The control panel for the vehicle of claim 1, wherein the plurality of buttons include a first set of buttons at a left side of the control pan& and a second set of buttons at a right side of the control panel,
   the first set of buttons are spaced apart from the second set of buttons, and
   the at least one conductive rib includes a conductive rib extending vertically and disposed on the plurality of buttons.

3. The control panel for the vehicle of claim 1, wherein the plurality of buttons include a first set of buttons at a left side of the control panel and a second set of buttons at a right side of the control panel,
   the first set of buttons are spaced apart from the second set of buttons, and
   the at least one conductive rib integrally comprises:
      a plurality of partition portions extending vertically and disposed between the plurality of buttons; and
      an upper end connecting portion connecting an upper end of each of the plurality, of partition portions.

4. The control panel for the vehicle of claim 3, wherein the at least one conductive rib further integrally comprises a lower end connecting portion connecting a lower end of the plurality of partition portions to each other.

5. The control panel for the vehicle of claim 1, wherein the plurality of buttons include a touch button.

6. The control panel for the vehicle of claim 1, wherein the plurality of buttons include a push button and are disposed to be movable back and forth.

7. The control panel for the vehicle of claim 1, wherein the plurality of buttons are simultaneously operated as a touch button and a push button.

8. The control panel for the vehicle of claim 1, wherein the metal layer is connected to an electrostatic protection circuit.

9. The control panel for the vehicle of claim 1, wherein the metal layer is connected to a touch controller.

10. The control panel for the vehicle of claim 1, wherein the electrode is formed on the frame by a laser directing structuring (LDS).

* * * * *